US007432780B2

(12) United States Patent
Chan et al.

(10) Patent No.: US 7,432,780 B2
(45) Date of Patent: Oct. 7, 2008

(54) RECTANGULAR-TO-CIRCULAR MODE POWER COMBINER/DIVIDER

(75) Inventors: Steven S. Chan, Alhambra, CA (US); Te Kao Wu, Rancho Palos Verde, CA (US); Arun K. Bhattacharvyya, El Segundo, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 270 days.

(21) Appl. No.: 11/287,414

(22) Filed: Nov. 23, 2005

(65) Prior Publication Data

US 2007/0115077 A1 May 24, 2007

(51) Int. Cl.
*H01P 5/12* (2006.01)
*H03H 7/48* (2006.01)

(52) U.S. Cl. ....................... 333/127; 333/132; 333/135; 333/137

(58) Field of Classification Search ................ 333/127, 333/132, 135, 137
See application file for complete search history.

(56) References Cited

U.S. PATENT DOCUMENTS 4,039,975 A * 8/1977 Debski ....................... 333/122
4,590,446 A 5/1986 Hsu et al.
4,704,611 A * 11/1987 Edwards et al. ............. 342/367
4,720,691 A 1/1988 Rammos
4,825,175 A 4/1989 Tsuda et al.
4,922,215 A * 5/1990 Bergero et al. .............. 333/137
6,313,714 B1 * 11/2001 Junker et al. ................ 333/125
6,636,127 B2 * 10/2003 Van Meter .................. 333/125
6,897,739 B2 5/2005 Chan et al.
7,016,645 B2 * 3/2006 Cavelier et al. ............ 455/12.1
7,242,360 B2 * 7/2007 Wu et al. .............. 343/781 CA

OTHER PUBLICATIONS

D/ Jefferies: "*Waveguides and Cavity Resonators*", @ http://www.ee.surrey.ac.uk/Personal/D.Jefferies/wguide.html, Jan. 14, 2005, pp. 1-10.

* cited by examiner

*Primary Examiner*—Robert J. Pascal
*Assistant Examiner*—Kimberly E Glenn
(74) *Attorney, Agent, or Firm*—Tarolli, Sundheim, Covell & Tummino LLP

(57) ABSTRACT

A rectangular-to-circular mode combiner/divider is provided. In one aspect of the invention, a power combiner is provided that comprises a plurality of rectangular waveguide ports arranged in an integral arrangement. Each rectangular waveguide port is operative to operate in a rectangular mode. The power combiner is also includes a circular waveguide port operative to operate in a circular mode, and a transition body that couples the plurality of rectangular waveguide ports to the circular waveguide port. The transition body has an inner transition cavity and an outer body operative to convert radio frequency (RF) signals between the rectangular mode and the circular mode, and provide a combined output signal at the circular waveguide port from RF signals received at the plurality rectangular waveguide ports.

20 Claims, 4 Drawing Sheets

RECTANGULAR-TO-CIRCULAR MODE POWER COMBINER/DIVIDER

TECHNICAL FIELD

This invention was made with Government support under Contract No. NM071041 awarded by National Aeronautics and Space Administration. The Government has certain rights in this invention.

BACKGROUND

Devices and methods for dividing and combining power in high frequency systems are employed, for example, in a transmitter for combining and dividing signals from a plurality of lower power devices to form a high power signal for transmission through a single antenna. Similarly, a signal from a single antenna may be divided into a plurality of signals for corresponding satellite or radar antennas. Waveguides are commonly employed in the art for dividing and combining high frequency signals. Generally, a waveguide is a hollow member that transmits high frequency energy, i.e. microwave and millimeter wave, along a longitudinal axis thereof. Waveguides are available in a variety of sizes and configurations such as a "Y" or a "T," in addition to a ring hybrid, among others.

The Magic-Tee is a well known waveguide power divider and combiner, wherein output ports or input ports are positioned at 90° bends to a main axis of an apparatus. Unfortunately, Magic-Tee dividers require extensive backshort tuning at each port to minimize loss, which results in increased manufacturing costs. Furthermore, additional 90° bends are required for an inline Magic-Tee configuration, which results in the consumption of additional volume along with further insertion loss. Additionally, multiple magic tees are required to provide further dividing and combining of signals.

SUMMARY

In one aspect of the invention, a power combiner is provided that comprises a plurality of rectangular waveguide ports arranged in an integral arrangement. Each rectangular waveguide port is operative to operate in a rectangular mode. The power combiner is also includes a circular waveguide port operative to operate in a circular mode, and a transition body that couples the plurality of rectangular waveguide ports to the circular waveguide port. The transition body has an inner transition cavity and an outer body operative to convert radio frequency (RF) signals between the rectangular mode and the circular mode, and provide a combined output signal at the circular waveguide port from RF signals received at the plurality rectangular waveguide ports.

In another aspect of the invention, an antenna feed system is provided. The antenna feed system comprises a plurality of parallel rectangular waveguides arranged in an integral rectangular arrangement, and a power combiner/divider having a plurality of rectangular waveguide ports arranged in an integral rectangular arrangement coupled to a circular waveguide port via a transition body. The plurality of rectangular waveguide ports are coupled to respective parallel rectangular waveguides of the plurality of parallel rectangular waveguides. A plurality of in-phase rectangular mode input signals, each having a respective power, are provided to the rectangular waveguide ports through the plurality of parallel rectangular waveguides and combined by the power combiner/divider to provide a circular mode output signal at the circular waveguide port having a power substantially equal to the sum of the respective powers of the plurality of in-phase rectangular mode input signals.

In yet another aspect of the invention, an antenna transmitter feed system is provided. The antenna feed transmitter system comprises a divider network that divides an input signal into a plurality of in-phase input signals, and a plurality of traveling wave tube amplifiers (TWTAs) operative to amplify the plurality of in-phase input signals to provide a plurality of in-phase input signals of substantially equal power. The system further comprises a plurality of parallel rectangular waveguides that transmit the plurality of in-phase input signals of equal power to in-phase input signals operating in a rectangular mode, and a power combiner. The power combiner comprises a plurality of rectangular waveguide input ports for receiving the plurality of in-phase input signals, a body transition for combining the in-phase input signals to provide an output signal having a power substantially equal to a sum of the power of the plurality of in-phase input signals, and a circular waveguide port that cooperates with the body transition to provide an output signal operating in a circular mode. The system further comprises a conical horn coupled to the circular waveguide port for transmitting the output signal.

DETAILED DESCRIPTION

The present invention relates to a high power combiner/divider that combines/divides electromagnetic radio frequency signals between a rectangular mode of operation and a circular mode of operation. The power combiner/divider includes a plurality of rectangular waveguide ports coupled to a circular waveguide port by a transition body. A plurality of radio frequency signals at a given power in the form of rectangular electromagnetic waves are applied to respective rectangular waveguide ports. The radio frequency signals are combined to provide a combined radio frequency signal at the circular waveguide port in the form of circular electromagnetic waves of a power equal to a sum of the plurality of radio frequency signals applied to the respective rectangular waveguide ports.

Alternatively, a radio frequency signal at a given power in the form of circular electromagnetic waves are applied to the circular waveguide port. The radio frequency signal is divided into a plurality of radio frequency signals that are provided in the form of rectangular electromagnetic waves, each having a power substantially equal to the power of the radio frequency signal divided by the number of the plurality of rectangular waveguide ports.

The term "radio frequency signals" as employed herein is meant to include both a radio frequency signal in an alternating current and voltage state and an electromagnetic field state in the form of electromagnetic wave patterns, and is further meant to include radio frequency signals covering a significant portion of the electromagnetic radiation spectrum (e.g., from about nine kilohertz to several thousand GHz). The term rectangular mode is meant to include radio frequency signals that are converted to rectangular electromagnetic waves (i.e., rectangular in nature with respect to the walls of a waveguide), and the term circular mode is meant to include radio frequency signals that are converted to circular electromagnetic waves (i.e., circular in nature with respect to the walls of a waveguide). A transverse electric mode is defined as a mode in which the entire electric field is in the transverse plane, which is perpendicular to the length of the waveguide (e.g., direction of energy travel) with part of the magnetic field being parallel to the length of the axis.

Figure 1:
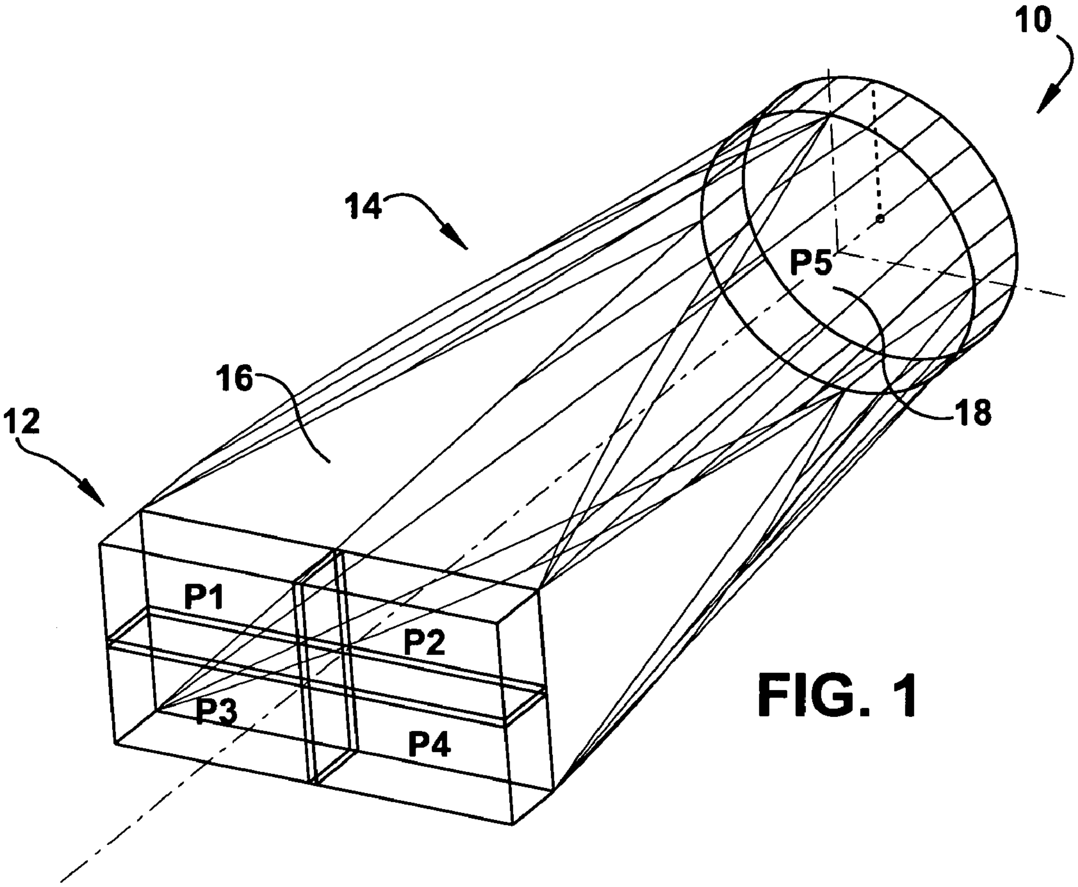
FIG. 1 illustrates a perspective view of a rectangular-to-circular mode power combiner/divider in accordance with an aspect of the present invention.

FIG. 1 illustrates a rectangular-to-circular mode power combiner/divider 10 in accordance with an aspect of the present invention. The rectangular-to-circular mode power combiner/divider 10 includes four rectangular waveguide ports, labeled ports P1, P2, P3 and P4 and one circular waveguide port, labeled P5. A first rectangular waveguide port P1 is disposed adjacent a second rectangular waveguide port P2 in a side-by-side manner. A third rectangular waveguide port P3 is disposed adjacent a fourth rectangular waveguide port P4 in a side-by-side manner. The first rectangular waveguide port P1 is disposed above the third rectangular waveguide port P3 and the second rectangular waveguide port P2 is disposed above the fourth rectangular waveguide port P4.

The four rectangular waveguide ports P1-P4 are arranged in an integral rectangular arrangement 12 with spacing (e.g., 0.010") between adjacent rectangular waveguide ports. The spacing allows for connectability to parallel rectangular waveguides. The four rectangular waveguide ports P1-P4 are designed to support a transverse electric (TE) rectangular mode, and in particular a $TE_{10}$ dominant mode, and receive or transmit TE rectangular electromagnetic energy. The circular waveguide port P5 are designed to support a TE circular mode, and in particular a $TE_{11}$ dominant mode, and receives or transmits circular mode electromagnetic energy.

The rectangular waveguide ports P1-P4 are operative to be connected to four respective parallel rectangular waveguides and the circular waveguide port P5 is operative to be connected to a transmitting antenna (e.g., a conical horn antenna) directly or indirectly via a polarizer. The rectangular-to-circular mode power combiner/divider 10 includes a transition body 14 that couples the rectangular waveguide ports P1-P4 to the circular waveguide port P5. The transition 14 includes an inner smooth transition cavity from rectangular waveguide ports P1-P4 to the circular waveguide port P5 designed to convert rectangular waveguide modes to circular waveguide modes with minimal reflection, and designed to convert circular waveguide modes to rectangular waveguide modes. The dimension of the transition cavity is selected to minimize the reflection loss.

The transition body 14 includes a first set of four triangle shaped outer walls 16 that are arranged with bases connected to respective outer perimeter side walls of the integral rectangular arrangement and apexes coupled to an outer circumference of the circular waveguide port P5. The transition 14 also includes a second set of four triangle shaped outer walls 18 that are arranged with bases connected to the outer circumference of the circular waveguide port P5 with apexes coupled to respective corners of the integral rectangular arrangement 12. The outer walls of the first set are interleaved with the outer walls of the second set.

It is to be appreciated that the number of rectangular waveguide ports can be more than four (e.g., six, eight, ten, twelve, sixteen) with a change in arrangement of the transition body 16. The waveguide ports and the transition body 16 may also be configured as a power divider rather than a power combiner, where the four parallel waveguides with small spaces therebetween can be stacked on top of one another and coupled to the rectangular waveguide ports P1-P4 as output ports with a circular waveguide coupled to the circular waveguide port P5 as an input port.

Figure 2:
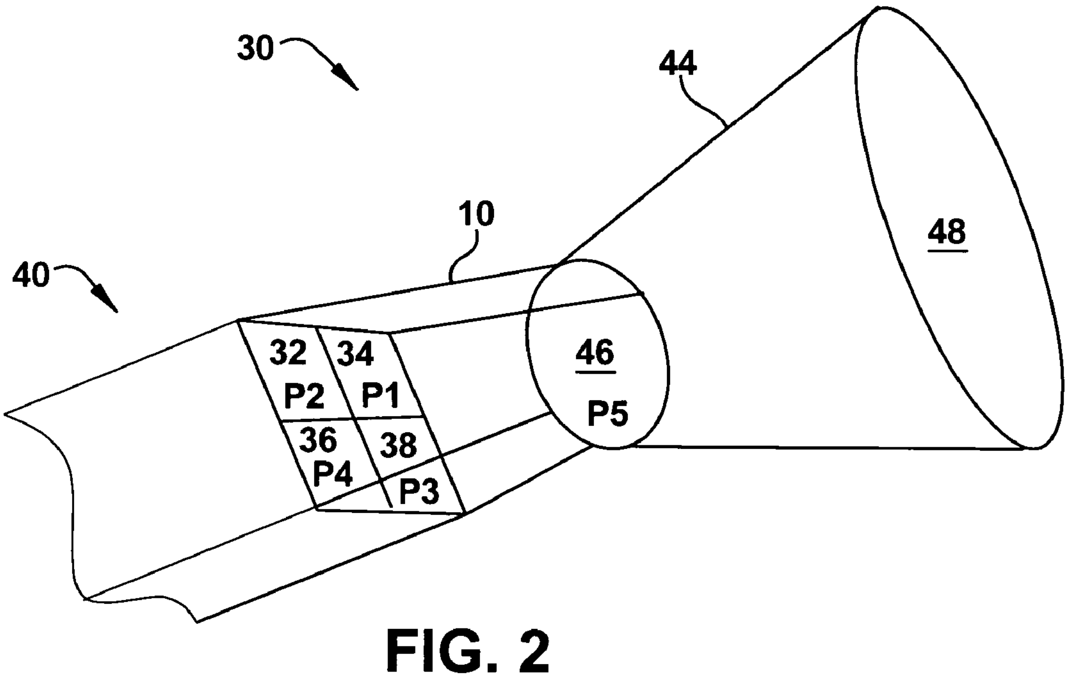
FIG. 2 illustrates a perspective view of an antenna feed system employing the power combiner/divider of FIG. 1.

FIG. 2 illustrates an antenna feed system 30 employing the power combiner/divider 10 of FIG. 1. As illustrated in FIG. 2, four rectangular waveguides 32, 34, 36 and 38 are integrated into a parallel rectangular arrangement 40 that is coupled to the power combiner 10, such that respective rectangular waveguides are coupled to respective rectangular waveguide ports P1-P4. A conical horn antenna 44 includes a first end having a first circular opening 46 that is coupled to the circular waveguide port P5 to transmit and receive RF energy. The conical horn antenna 44 includes a second end having a second circular opening 48 for transmitting and receiving radio frequency signals (e.g., micro wave signals, millimeter wave signals).

A transmitter section (not shown) transmits four in-phase input signals to the four rectangular waveguides 32, 34, 36 and 38. The combiner/divider 10 receives four parallel in-phase input signals from the four rectangular waveguides 32, 34, 36 and 38 to the respective rectangular waveguide ports. Each of the four parallel in-phase input signals have a given power (e.g., 250 watts/signal). The rectangular waveguides 32, 34, 36 and 38 and the rectangular waveguide ports P1-P4 each operate in rectangular mode and support a dominant $TE_{10}$. The power combiner/divider 10 combines the four parallel in-phase input signals into a single output signal of a power substantially equal to the sum of the power (e.g., 1000 watts) of the four parallel in-phase input signals, and converts the input signals from the rectangular mode to a circular mode. The circular waveguide operates in a circular mode and supports a $TE_{11}$ dominate mode. The circular mode single output signal is then transmitted through the conical horn antenna 44, for example, to one or more antenna reflectors. Alternatively, the conical horn antenna 44 receives an input signal in a circular mode, and the power combiner/divider 10 divides the input signal into four in-phase rectangular mode output signals of substantially equal power that are transmitted through respective rectangular waveguides to a receiving section (not shown).

Figure 3:
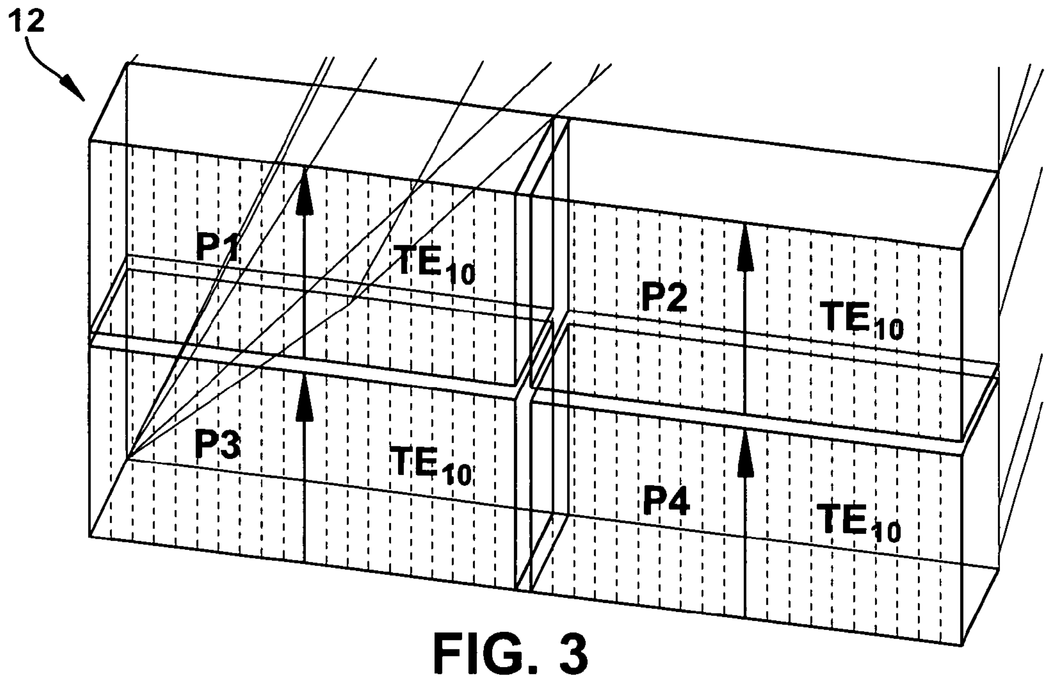
FIG. 3 illustrates wave patterns as a result of electromagnetic energy applied at the four rectangular waveguide ports of the power/combiner of FIG. 1.
Figure 4:
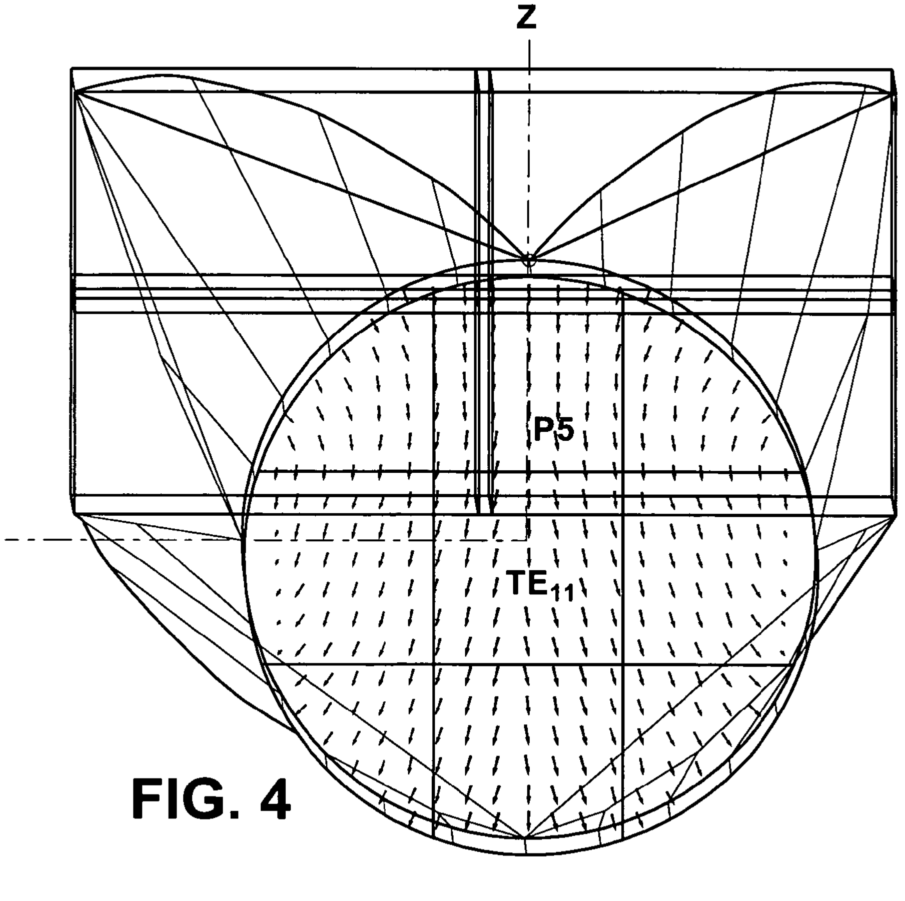
FIG. 4 illustrates wave patterns as a result of electromagnetic energy applied at the circular waveguide port of the power/combiner of FIG. 1.

FIG. 3 illustrates wave patterns as a result of electromagnetic energy applied to the four rectangular waveguide ports of the power/combiner 10 of FIG. 1. The rectangular waveguide ports P1-P4 support the $TE_{10}$ rectangular waveguide mode and other higher order modes are evanescent. The parallel lines illustrate the electrical fields generated within the waveguides of the rectangular waveguide ports. FIG. 4 illustrates wave patterns as a result of electromagnetic energy applied to the circular waveguide port of the power/combiner 10 of FIG. 1. The circular waveguide port P5 supports the circular $TE_{11}$ operating mode. The circular lines illustrate the electrical fields generated within the waveguide of the circular waveguide port. When each of the rectangular waveguide ports is excited in-phase, the combined field propagates toward the circular waveguide port P5. The transition of the input and output ports produce higher order modes for each of the ports. The higher order modes manifest as reactance (which causes input mismatch) to the input waveguides because they are non-propagating. The dimension of the transition cavity within the power/combiner 10 can be selected to minimize this reactance.

For deep space communication system, the transmitted RF power requirement is high, which is typically produced from a single TWT (Traveling Wave Tube) source. A single power source is susceptible to a single point failure, which is not desirable. Additionally, a single waveguide and antenna will have to be substantially large for handling high power transmit signals, such as 1000 watts. The larger antenna will take up additional space, for example, in a main reflector reducing the gain and reliability of the antenna. To improve the reliability of the communication system, multiple TWTs can be employed utilizing the power combiner of the present invention, which will allow a graceful degradation in the case of a failed source, as opposed to a single point failure in addition to providing a compact low loss solution at microwave frequency bands and millimeter wave frequency bands.

Figure 5:
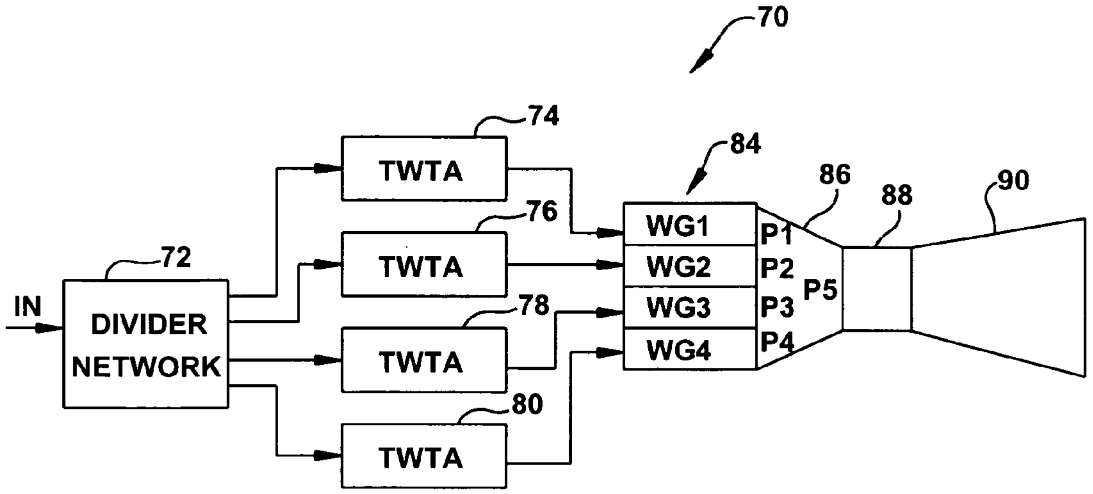
FIG. 5 illustrates an antenna transmitter feed system in accordance with an aspect of the present invention.

FIG. 5 illustrates an antenna transmitter feed system 70 in accordance with an aspect of the present invention. The system 70 includes a divider network 72 that receives an input signal for transmission. The divider network 72 divides the input signal into four in-phase signals of substantially equal power. The four in-phase signals are provided to respective traveling wave tube amplifiers (TWTAs) 74, 76, 78 and 80. The TWTAs 74, 76, 78 and 80 amplify the four in-phase signals to provide four in-phase signals of substantially equal power. Each TWTA is coupled to a first end of a respective rectangular waveguide. For example, a first in-phase signal is amplified by TWTA 74 and provided to a first waveguide WG1, a second in-phase signal is amplified by TWTA 76 and provided to a second waveguide WG2, a third in-phase signal is amplified by TWTA 78 and provided to a third waveguide WG3, and a fourth in-phase signal is amplified by TWTA 80 and provided to a fourth waveguide WG4.

A second end of each of the respective waveguides WG1-WG4 is coupled to a respective rectangular waveguide input ports P1-P4 of a rectangular-to-circular mode power combiner 86. The power combiner 86 combines the four in-phase signals of substantially equal power to provide an output signal at a circular waveguide output port P5 having a power substantially equal to sum of the power of the four input signals provided at the rectangular waveguide input ports P1-P4. For example, each in-phase signal can have a power of about 250 watts for a combined output signal power of 1000 watts. The power combiner 86 also converts the rectangular mode input signals into a circular mode output signal. The circular output port P5 is coupled to a first end of a polarizer 88. The polarizer polarizes the output signal. The polarizer 88 has a circular body having a first end integral with the circular output port P5 of the power combiner 86. A conical horn antenna 90 extends from a second end of the polarizer 88. The conical horn antenna 90 transmits the polarized combined output signal, for example, via a sub-reflector and a main reflector.

Figure 6:
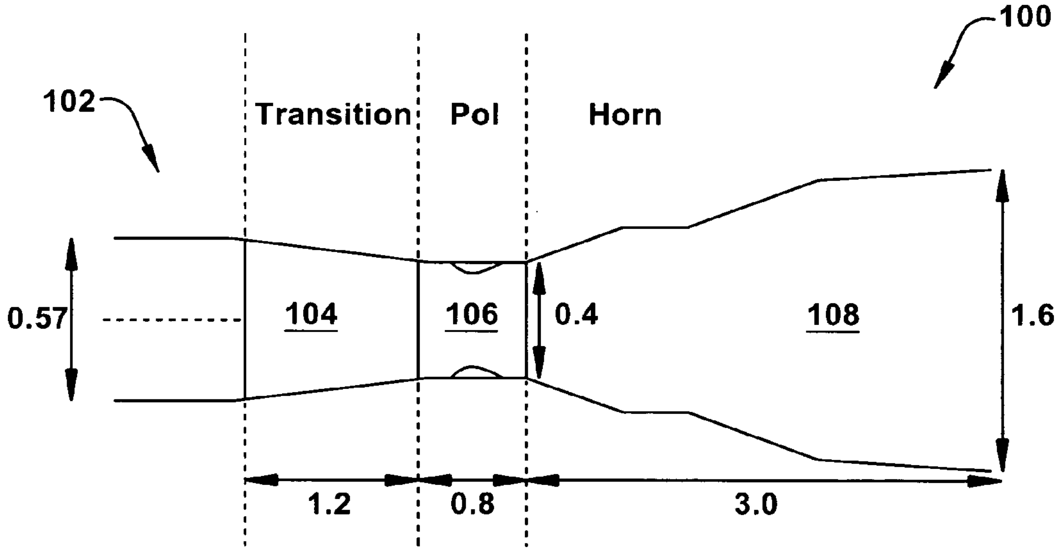
FIG. 6 illustrates an antenna feed system for transmitting and receiving signals having frequencies within a Ka band in accordance with an aspect of the present invention.

FIG. 6 illustrates an antenna feed system 100 for transmitting and receiving signals having frequencies within a Ka band in accordance with an aspect of the present invention. The Ka band has a frequency range from about 18 gigahertz to about 40 gigahertz. The antenna feed system 100 can be employed in a satellite antenna system employing one or more subreflectors and main reflectors. Therefore, the dimension of the antenna feed system 100 are selected to provide the appropriate waveguide length to operate in the Ka band range with optimal performance around 32 gigahertz. The antenna feed system 100 includes four rectangular waveguides in a rectangular waveguide arrangement 102 coupled to a rectangular-to-circular mode power combiner/divider transition 104. The rectangular-to-circular mode power combiner/divider transition 104 has four rectangular waveguide ports arranged in an integral rectangular arrangement with spacing between adjacent rectangular waveguide ports on a first end and a circular waveguide port coupled to a second end, as illustrated in FIG. 1. The rectangular waveguides are coupled to the rectangular waveguide ports and operative to provide four in-phase input or output signals in a rectangular operating mode of substantially equal power to or from the rectangular-to-circular mode power combiner/divider transition 104.

The height of the rectangular waveguide arrangement 102 and the integral rectangular arrangement of the rectangular waveguide ports is about 0.57". The length of the rectangular-to-circular mode power combiner/divider 104 is about 1.2". The 1.2" length is selected to provide operation at frequencies within the Ka band (e.g., about 32 GHz). The rectangular-to-circular mode power/combiner transition 104 has a circular waveguide port. The circular waveguide port of the rectangular-to-circular mode power combiner/divider transition 104 is coupled to a first end of a polarizer 106. The polarizer has a length that is about 0.8". The polarizer 106 is coupled at a second end to a first end of a horn antenna 108. The polarizer 106, the circular waveguide port of the rectangular-to-circular mode power combiner/divider transition 104, and the first end of the conical horn antenna 108 have a height that is about 0.4 inches. A second end of the conical horn antenna 108 has a height of about 1.6 inches. The length of the horn antenna 108 is about 3.0 inches. The dimensions and components of the antenna feed system 100 are selected to handle high power transmission signals, for example, about 1000 watts, and about 250 watts per rectangular waveguide.

Figure 7:
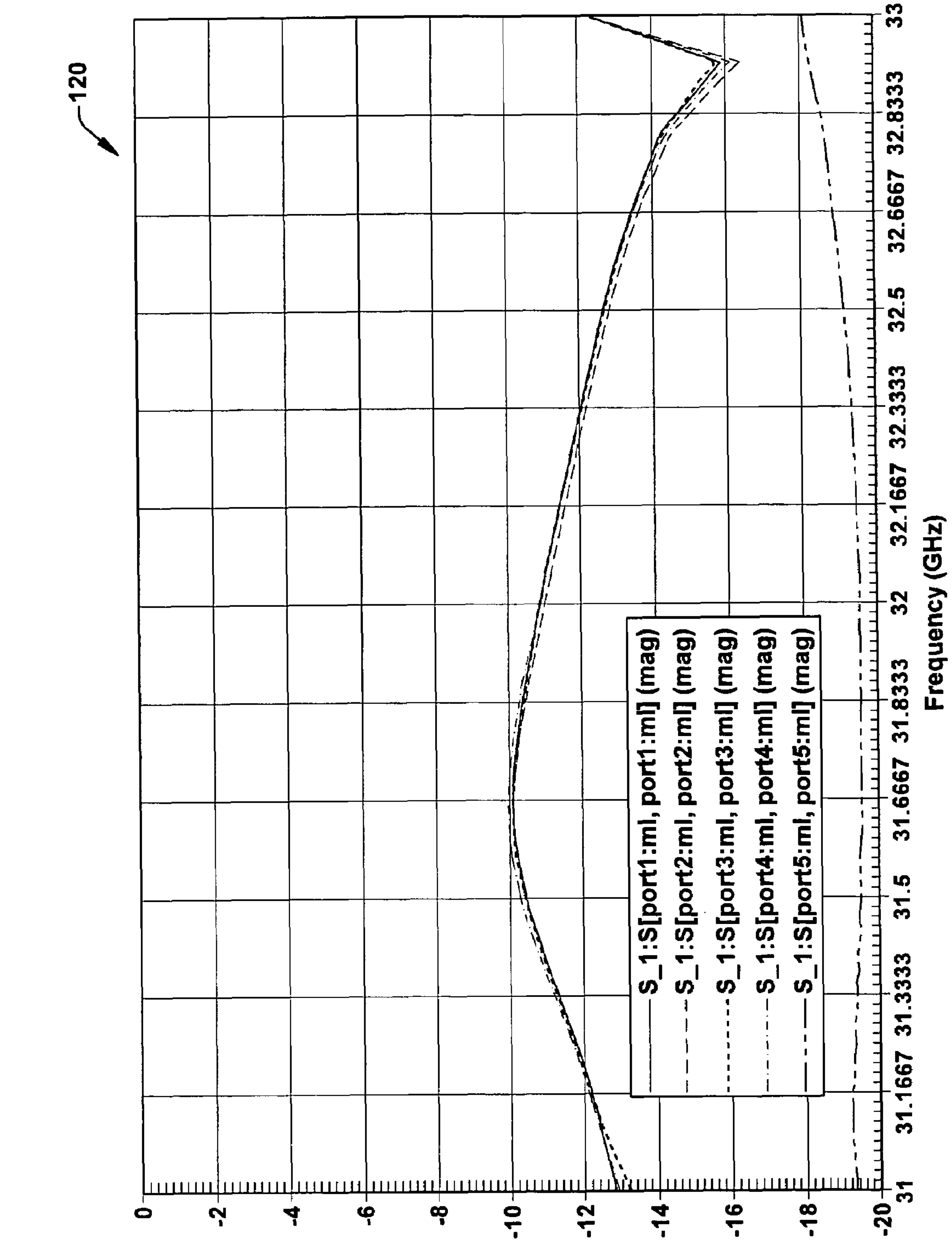
FIG. 7 illustrates a graph of return loss versus frequency for each of the rectangular waveguide ports and circular waveguide ports of the rectangular-to-circular mode power combiner/divider of FIG. 6.

FIG. 7 illustrates a graph 120 of return loss versus frequency for each of the rectangular waveguide ports and circular waveguide ports of the rectangular-to-circular mode power combiner/divider of FIG. 6. As illustrated in the graph 120 of FIG. 7, each of the individual waveguide is better than about −16 db at 32 GHz (i.e., Ka band) in the power combiner mode. From reciprocity, the return loss is −18 db @32 Ghz in line care of a power divider mode. The port to port isolation between each parallel port is acceptable.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A power combiner comprising:

a plurality of rectangular waveguide ports arranged in an integral arrangement, each of the plurality of rectangular waveguide ports being operative to operate in a rectangular mode;

a circular waveguide port operative to operate in a circular mode; and a transition body that couples the plurality of rectangular waveguide ports to the circular waveguide port, the transition body having an inner transition cavity and an outer body operative to convert radio frequency (RF) signals between the rectangular mode and the circular mode, and provide a combined output signal at the circular waveguide port from RF signals received at the plurality rectangular waveguide ports.

2. The power combiner of claim 1, wherein the power combiner is operative to operate as a power divider, such that a signal received at the circular waveguide port is divided into a plurality of in-phase signals of substantially equal power provided to respective rectangular waveguide ports of the plurality of rectangular waveguide ports.

3. The power combiner of claim 1, wherein the plurality of rectangular waveguide ports support a transverse electric ($TE_{10}$) dominant mode and the circular waveguide port supports a $TE_{11}$ dominant mode.

4. The power combiner of claim 1, wherein the plurality of rectangular waveguides comprise four waveguides arranged in an integral rectangular arrangement with spaces therebetween to allow for connectability to respective parallel rectangular waveguides.

5. The power combiner of claim 4, wherein the transition body comprises a first set of four generally triangle shaped outer walls arranged with bases connected to respective outer perimeter side walls of the integral rectangular arrangement and apexes coupled to an outer circumference of the circular waveguide port, and a second set of four generally triangle shaped outer walls arranged with bases coupled to the circular waveguide port and apexes coupled to respective corners of the integral rectangular arrangement, such that outer walls of the first set are interleaved with outer walls of the second set.

6. The power combiner of claim 1, in combination with a plurality of parallel waveguides coupled to respective ones of the plurality of rectangular waveguide ports and a conical horn antenna coupled to the circular waveguide port to form an antenna feed system.

7. The power combiner of claim 6, wherein the antenna feed system further comprises a polarizer disposed between the circular waveguide port and the horn antenna.

8. The power combiner of claim 7, wherein a length of the power combiner is about 1.2 inches.

9. The power combiner of claim 1, wherein a length of the power combiner is selected to provide operation in the Ka band.

10. The power combiner of claim 1, wherein the plurality of rectangular waveguide ports is one of four, six, eight, ten, twelve and sixteen.

11. An antenna feed system comprising:

a plurality of parallel rectangular waveguides arranged in an integral rectangular arrangement;

a power combiner/divider having a plurality of rectangular waveguide ports arranged in an integral rectangular arrangement coupled to a circular waveguide port via a transition body, the plurality of rectangular waveguide ports being coupled to respective parallel rectangular waveguides of the plurality of parallel rectangular waveguides; and wherein a plurality of in-phase rectangular mode input signals, each having a respective power, provided to the rectangular waveguide ports through the plurality of parallel rectangular waveguides are combined by the power combiner/divider to provide a circular mode output signal at the circular waveguide port having a power substantially equal to the sum of the respective powers of the plurality of in-phase rectangular mode input signals.

12. The antenna feed system of claim 11, wherein a circular mode input signal received at the circular waveguide port having a given power is divided into respective in-phase rectangular mode output signals each having powers substantially equal to the power of the input signal divided by the number of rectangular waveguide ports.

13. The antenna feed system of claim 11, wherein the plurality of rectangular waveguide ports support a transverse electric ($TE_{10}$) dominant mode and the circular waveguide port supports a $TE_{11}$ dominant mode.

14. The antenna feed system of claim 11, further comprising a conical horn antenna coupled to the circular waveguide port.

15. The antenna feed system of claim 14, further comprising a polarizer disposed between the conical horn antenna and the circular waveguide port.

16. The antenna feed system of claim 11, wherein the plurality of rectangular waveguide ports comprise four waveguide ports arranged in an integral rectangular arrangement with spaces therebetween to allow for connectability to four respective ones of the plurality of parallel rectangular waveguides, each of the parallel rectangular waveguides and the rectangular waveguide ports operative to handle signals of at least 250 watts, and the circular waveguide port is operative to handle signals of at least 1000 watts.

17. An antenna transmitter feed system comprising:

a divider network that divides an input signal into a plurality of in-phase input signals;

a plurality of traveling wave tube amplifiers (TWTAs) operative to amplify the plurality of in-phase input signals to provide an amplified plurality of in-phase input signals of substantially equal power;

a plurality of parallel rectangular waveguides that transmit the plurality of in-phase input signals of equal power to in-phase input signals operating in a rectangular mode;

a power combiner comprising:

a plurality of rectangular waveguide input ports for receiving the plurality of in-phase input signals;

a body transition for combining the in-phase input signals to provide an output signal having a power substantially equal to a sum of the power of the plurality of in-phase input signals; and a circular waveguide port that cooperates with the body transition to provide an output signal operating in a circular mode; and a conical horn coupled to the circular waveguide port for transmitting the output signal.

18. The antenna transmitter feed system of claim 17, wherein the number of the in-phase input signals, the TWTAs, the parallel rectangular waveguides and the rectangular waveguide ports is four.

19. The antenna transmitter feed system of claim 17, wherein the circular waveguide port operates in the $TE_{11}$ mode and the rectangular waveguide ports operates in the $TE_{10}$ mode.

20. The antenna transmitter feed system of claim 17, wherein each of the parallel rectangular waveguides and the rectangular waveguide ports are operative to handle signals of at least 250 watts at frequencies of at least 17 GHz.

* * * * *